(12) United States Patent
Yamaguchi et al.

(10) Patent No.: US 6,988,407 B2
(45) Date of Patent: Jan. 24, 2006

(54) ACCELERATION SENSOR

(75) Inventors: Yasuo Yamaguchi, Tokyo (JP); Kunihiro Nakamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 109 days.

(21) Appl. No.: 10/816,812

(22) Filed: Apr. 5, 2004

(65) Prior Publication Data

US 2005/0044953 A1    Mar. 3, 2005

(30) Foreign Application Priority Data

Sep. 3, 2003    (JP) .............................. 2003-311066

(51) Int. Cl.
*G01P 1/02*    (2006.01)
(52) U.S. Cl. .................. 73/493; 73/514.32; 73/514.01
(58) Field of Classification Search .................. 73/493, 73/514.01, 514.32
See application file for complete search history.

(56) References Cited

U.S. PATENT DOCUMENTS 6,441,450 B1    8/2002  Yamaguchi et al.
6,892,577 B2 *  5/2005  Nagahara .................. 73/514.32

FOREIGN PATENT DOCUMENTS

JP    2000-187040    7/2000
JP    2001-337103    12/2001

* cited by examiner

*Primary Examiner*—John E. Chapman
(74) *Attorney, Agent, or Firm*—Oblon, Spivak, McClelland, Maier & Neustadt, P.C.

(57) ABSTRACT

An acceleration sensor includes an acceleration sensor element and a frame portion surrounding the element. The sensor element and the frame portion are located on a major surface of a substrate. An intermediate layer is formed on the frame portion. A cap portion is bonded to the intermediate layer, thereby sealing-off the acceleration sensor element. Grooves in the form of a frame are provided in the frame portion and the intermediate layer, respectively, and located at positions generally identical to each other with regard to the major surface direction of the substrate.

4 Claims, 5 Drawing Sheets

ACCELERATION SENSOR

RELATED APPLICATION

This application is based on Japanese Patent Application No. 2003-311066, the content of which being incorporated herein by reference.

BACKGROUND OF THE INVENTION

1. Field of the Invention

The present invention relates to an acceleration sensor.

2. Description of the Related Art

Conventionally, there has been known an acceleration sensor in which an acceleration sensor element and a frame portion surrounding the element are deposited on a semiconductor substrate and the element is sealed off by bonding a cap to the frame portion, as disclosed in, for example, U.S. Pat. No. 6,441,450.

However, since both the acceleration sensor element and the frame portion are formed on the semiconductor substrate, if a crack is generated at a junction region between the cap and frame portion due to an external force or there is a residual stress at the junction region due to the difference in thermal expansion coefficient between the cap and the frame portion made of different materials, such crack or stress may easily advance or propagate and reach the acceleration sensor element. This may cause the characteristic of the acceleration sensor to change.

SUMMARY OF THE INVENTION

An object of the present invention is to provide an acceleration sensor in which the characteristic thereof does not change due to an external force or residual stress.

To achieve the above object, a first aspect of the present invention is an acceleration sensor that includes an acceleration sensor element and a frame portion surrounding the element. The element and the portion are located on a major surface of a substrate. An intermediate layer is formed on the frame portion. A cap portion is bonded to the intermediate layer, thereby sealing-off the acceleration sensor element. Grooves in the form of a frame are provided in the frame portion and the intermediate layer, respectively, and located at positions generally identical to each other with regard to the major surface direction of the substrate.

In accordance with the first aspect of the present invention, since the frame grooves are formed in the intermediate and the frame portion, a crack which may be generated by an external force at a junction region between the cap portion and the frame portion stops advancing at the grooves. This keeps the sealing-off of the sensor, preventing the characteristic of the sensor element from changing. Also, since the frame grooves in the intermediate layer and the frame portion are located at generally identical positions with regard to the major surface direction, the size of the acceleration sensor with regard to the major surface direction of the substrate can be reduced.

A second aspect of the present invention is an acceleration sensor that includes an acceleration sensor element and a frame portion surrounding the element. The element and the portion are located on a major surface of a substrate. An intermediate layer is formed on the frame portion. A cap portion is bonded to the intermediate layer, thereby sealing-off the acceleration sensor element. The frame portion has a part extended from a junction region between the intermediate layer and the cap portion toward the acceleration sensor element. The part is provided with a groove in the form of a frame surrounding the acceleration sensor element.

In accordance with the second aspect of the present invention, since the extended part of the frame portion is formed with the frame groove which surrounds the acceleration sensor element, a residual stress at a junction region between the intermediate layer and the cap portion does not propagate beyond the groove. This prevents the characteristic of the acceleration sensor element from changing.

BRIEF DESCRIPTION OF THE DRAWINGS

The above-mentioned and other objects, advantages and features of the invention will become apparent from the following description thereof taken in conjunction with the accompanying drawings in which.

DETAILED DESCRIPTION OF THE PREFERRED EMBODIMENTS

With reference to the drawings, preferred embodiments of the present invention will be described hereinafter.

First Embodiment

Figure 1:
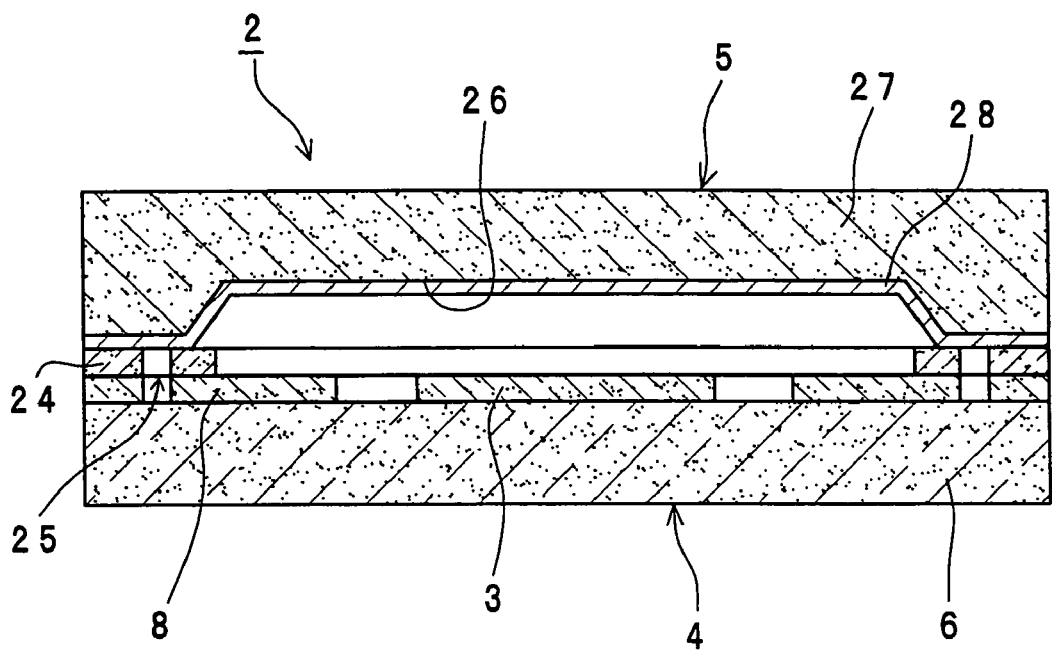
FIG. 1 is a cross-sectional view showing a first embodiment of the acceleration sensor according to the invention.

Referring to FIG. 1, there is shown an acceleration sensor, which is a first embodiment according to the present invention. The sensor, indicated generally at reference number 2, includes a base portion 4 on which an acceleration sensor element 3 is located and a cap portion 5 bonded to the base portion for sealing off the sensor element 3.

Figure 2:
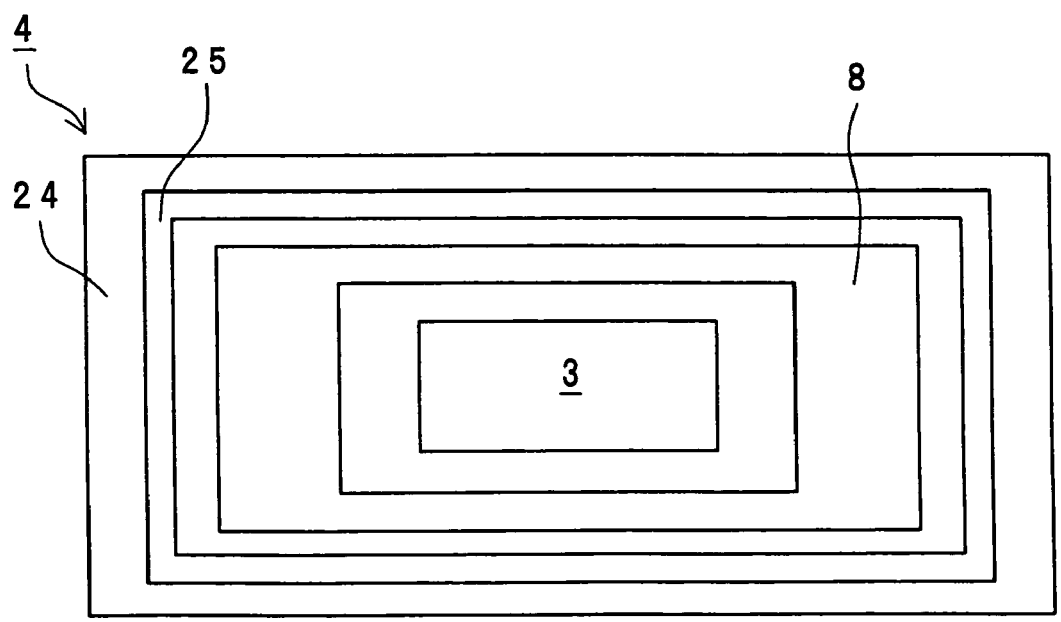
FIG. 2 is a top view of the base portion of FIG. 1.

With reference also to FIG. 2, the base portion 4 includes a silicon semiconductor substrate 6 (broadly, substrate) in the form of a rectangle. The sensor element 3 and a frame portion 8 surrounding the element 3 are formed on a major surface of the semiconductor substrate 6. Although the frame portion 8 is typically rectangular, the shape of the frame portion 8 is not restrictive of the invention. The sensor element 3 and the frame portion 8 are formed by, for example, depositing a polycrystalline silicon layer doped with phosphorus as impurity on the semiconductor substrate 6 and then selectively removing the polycrystalline silicon layer using, for example, an etching technique. Other dopants such as gallium, boron or arsenic may be used instead of phosphorus.

Figure 3A:
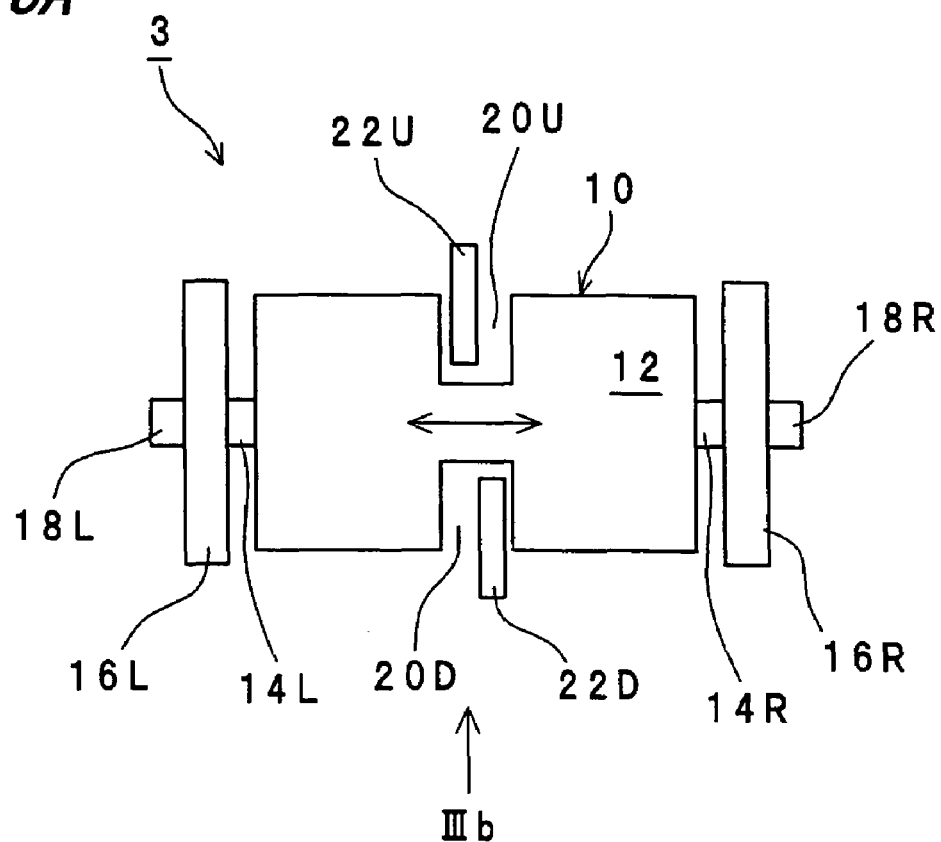
FIG. 3A is a top view of the acceleration sensor element of FIG. 1.
Figure 3B:
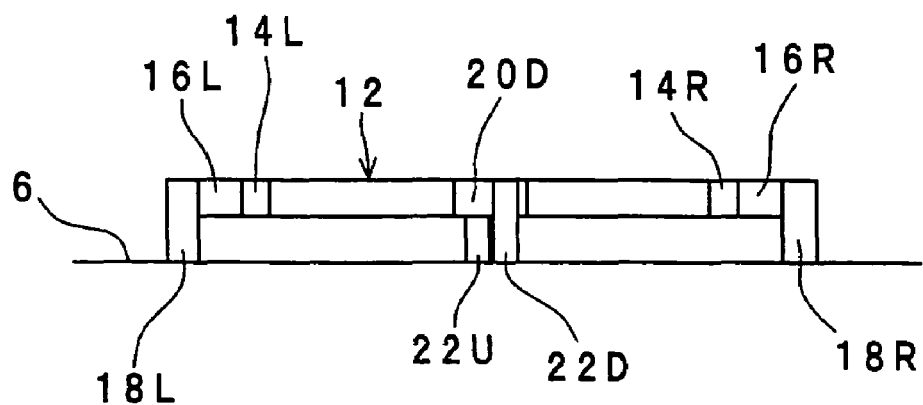
FIG. 3B is a side view of the acceleration sensor element seen from the direction IIIb in FIG. 3A.

FIGS. 3A and 3B show the acceleration sensor element 3 in enlarged form. The element 3 is a capacitive acceleration sensor element which includes a weight 10 which is displaced by an external force. The weight 10 has a movable electrode 12 in the form of a general rectangle, which is spaced away from the major surface of the semiconductor substrate 6. The movable electrode 12 has wide sides along the left and right direction and narrow sides along the up and down direction of FIG. 3A. The movable electrode 12 is connected with supports 18L and 18R fixed on the major surface of the semiconductor substrate 6, via extensions 14L and 14R each extended in the left and right direction from the narrow side of the electrode 12 and beams 16L and 16R extended in the up and down direction of FIG. 3A, respectively. Each of the beams 16L and 16R has a length (width) in the left and right direction shorter than that in the up and down direction of FIG. 3A so that it is slightly stretchable in the left and right direction. Accordingly, an external force acting on the acceleration sensor 2 in the left and right direction causes the movable electrode 12 to be displaced in the direction. The movable electrode 12 is formed with grooves 20U and 20D each having a given size and extending from a central portion of the wide side of the electrode 12 in the up and down direction of FIG. 3A. Electrodes 22U and 22D are fixed on the major surface of the semiconductor substrate 6 and located in the grooves 20U and 20D, respectively. An external force acting on the acceleration sensor 2 causes the gap between the fixed electrode 22U and the internal wall of the groove 20U of the movable electrode 12 and the gap between the fixed electrode 22D and the internal wall of the groove 20D of the movable electrode 12 to be changed. As a result, the capacitance between the movable electrode 12 and each of the fixed electrodes 22U and 22D is changed. Note that polycrystalline silicon, which is the material of the electrodes 12, 22U and 22D, is doped with phosphorus, as described above, in order to achieve electrical conduction. The change of capacitance is outputted in the form of electrical signal to an external circuit not shown for determining the capacitance.

The present invention is not limited to the particular construction of the acceleration sensor element 3 described above. For example, the movable electrode may be displaced in a direction perpendicular to the major surface of the semiconductor substrate 6. Also, a piezoresistive sensing element may be used instead of the capacitive sensing element.

Referring back to FIGS. 1 and 2, a non-doped polycrystalline silicon layer 24 is formed on the frame portion 8. The polycrystalline silicon layer 24 is, for example, a silicon oxide layer formed using a conventional technique such as CVD. The polycrystalline silicon layer 24 has a thickness designed to prevent phosphorus contained in polycrystalline silicon of the frame portion 8 from reaching a junction interface between the polycrystalline silicon layer 24 and the cap portion 5 and precipitating at the interface. The polycrystalline silicon layer 24 constitutes an intermediate layer between the frame portion 8 and the cap portion 5. The frame portion 8 and the polycrystalline silicon layer 24 are formed with through holes, respectively, in the form of a frame at generally identical positions with regard to the major surface direction. These through holes constitute, as a whole, a groove 25 in the form of a frame.

The cap portion 5 includes a cap or body 27 having a concave part 26 formed by, for example, a spot facing of a rectangular semiconductor substrate. A metallic layer 28 is formed on a major surface of the cap 27 which defines the concave part 26. The metallic layer 28 is formed by means of, for example, a vapor depositing or sputtering of a titanium layer and then a nickel layer. The titanium layer and the nickel layer suitably have a thickness of several tens of nanometers and several hundreds of nanometers, respectively, in consideration of a bonding strength between the metallic layer 28 and the polycrystalline silicon layer 24 and a residual stress generated due to the forming process of the metallic layer 28.

In the manufacturing process of the acceleration sensor 2, with the metallic layer 28 of the cap portion 5 placed over the polycrystalline silicon layer 24 of the base portion 4, the base portion 4 and the cap portion 5 are heated in a heating furnace under a vacuum or an inert gas. The heating temperature may be about 400° C. and the heating time in the range between several tens of minutes and several hours. The heating causes polycrystalline silicon in the polycrystalline silicon layer 24 ant nickel in the metallic layer 28 to form an eutectic alloy, so that the base and the cap portions 4 and 5 are bonded to each other. In this step, since the non-doped polycrystalline silicon layer 24 is located between the doped frame portion 8 of the base portion 4 and the metallic layer 28, even if phosphorus contained in polycrystalline silicon of the frame portion 8 diffuses into the non-doped polycrystalline silicon layer 24, it does not reach and precipitate a junction interface between the polycrystalline silicon and the metallic layers 24 and 28. As a result, bonding failure between the base and the cap portions 4 and 5 can be prevented.

Since the acceleration sensor 2 has a multilayer at a junction region between the base portion 4 and the cap portions 5, it is easily subject to various external forces. For example, where the acceleration sensor 2 is heated in a die bonding process so that it is bonded to a metal frame not shown, a residual stress may be generated due to a difference in thermal expansion coefficient between the silicon semiconductor substrate 6 and the metal frame to which the substrate 6 has been bonded. In an encapsulation process in which components such as the acceleration sensor 2 are encapsulated with resin after the die bonding process, a pressure is applied when the resin is injected into a mold. After a device incorporated with the acceleration sensor 2 has been manufactured, a stress change may occur due to a deterioration of the mold or the die-bonded sections caused by an environment (e.g. thermal hysteresis or humidity) to which the acceleration sensor 2 is exposed.

Without the groove 25, such external forces might produce a crack at the interface(s) between the layers of the junction region (i.e. interfaces between the semiconductor substrate 6 and frame portion 8 and between the frame portion 8 and polycrystalline silicon layer 24). This might cause the sealing-off of the acceleration sensor 2 to break, resulting in a characteristic change of the acceleration sensor element 3. Even if a crack does not occur, a stress might propagate via the frame portion 8 and/or the semiconductor substrate 6 to the acceleration sensor element 3, resulting in a characteristic change thereof.

In contrast, in the embodiment, even if a crack is generated by an external force, it stops advancing at the groove 25. This keeps the sealing-off of the sensor 2, preventing the characteristic of the sensor element 3 from changing. Also, since a stress does not propagate beyond the groove 25, the characteristic of the sensor element 3 is unchanged. As such, the groove 25 allows a reliable acceleration sensor to be provided.

Also, in the embodiment, since the frame groove in the frame portion 8 and the frame groove in the polycrystalline silicon layer 24 are overlapped with each other, the size of the acceleration sensor 2 with regard to the major surface direction of the semiconductor substrate 6 can be reduced.

Second Embodiment

Figure 4:
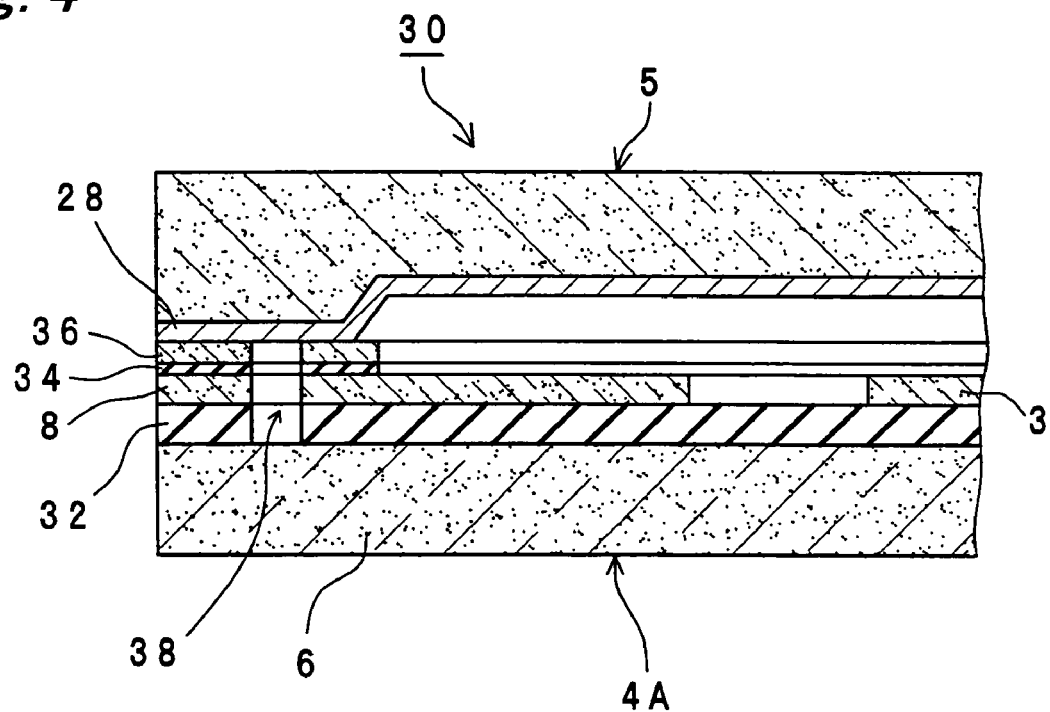
FIG. 4 is an enlarged partial cross-sectional view showing a second embodiment of the acceleration sensor according to the invention.

With reference to FIG. 4, a second embodiment of the acceleration sensor according to the present invention will now be described. In a description below, components identical or similar to those in the first embodiment are indicated by identical reference numbers or those with suffixes.

The acceleration sensor 30 of the embodiment includes an insulation layer 32 on the major surface of the semiconductor substrate 6. The insulation layer 32 is formed by depositing on the semiconductor substrate 6, for example, a silicon oxide layer and then silicon nitride layer using a conventional technique such as CVD. The acceleration sensor element 3 and the frame portion 8 are formed on the insulation layer 32 so that they are electrically insulated.

An diffusion preventing layer consisting of an insulation layer 34 and a non-doped polycrystalline silicon layer 36 is formed between the metallic layer 28 and the frame portion 8 instead of interposing the polycrystalline silicon layer 24 having a predetermined thickness therebetween as in the first embodiment. The layers 34 and 36 constitute an intermediate layer between the frame portion 8 and the cap portion 5. To this end, in the manufacturing of the base portion 4A, the insulation layer 34 is formed on the frame portion 8 using, for example, a CVD technique and then the polycrystalline silicon layer 36 using, for example, a sputtering technique. Next, with the metallic layer 28 of the cap portion 5 placed over the polycrystalline silicon layer 36 of the base portion 4A, the base portion 4A and the cap portion 5 are heated as in the first embodiment so that polycrystalline silicon in the polycrystalline silicon layer 36 and nickel in the metallic layer 28 form an eutectic alloy in order to bond the cap portion 5 to the base portion 4A. The diffusion preventing layer 34 interposed between the polycrystalline silicon layer 36 and the frame portion 8 prevents phosphorus contained in polycrystalline silicon of the frame portion 8 from diffusing into the non-doped polycrystalline layer 36 and precipitating at a junction interface between the polycrystalline silicon and the metallic layers 36 and 28.

The insulation layer 32, the frame portion 8, the insulation layer 34 and the polycrystalline silicon layer 36 are formed with through holes, respectively, in the form of a frame at generally identical positions with regard to the major surface direction. These through holes constitute, as a whole, a groove 38 in the form of a frame.

The acceleration sensor 30 so constructed has a multilayer at a junction region between the base portion 4A and the cap portion 5 and is therefore easily subject to external forces. However, even if a crack is generated by an external force, it stops advancing at the groove 38. This keeps the sealing-off of the sensor 30, allowing the characteristic of the sensor element 3 to be unchanged. Also, since a stress does not propagate beyond the groove 38, the characteristic of the sensor element 3 is unchanged. As such, the groove 38 allows a reliable acceleration sensor to be provided.

Also, in the embodiment, since the frame grooves in the insulation layer 32, the frame portion 8, the insulation layer 34 and the polycrystalline silicon layer 36 are overlapped with each other, the size of the acceleration sensor 30 with regard to the major surface direction of the semiconductor substrate 6 can be reduced.

The semiconductor substrate 6 may be formed with a groove in the form of a frame which is located at a position generally identical to those of the insulation layer 32, the frame portion 8, the insulation layer 34 and the polycrystalline silicon layer 36 with regard to the major surface direction, so that the frame groove of the substrate 6 constitutes, together with the layers 32, 8, 34 and 36, the frame groove 38. This results in a stress propagation distance longer than a configuration in which the groove 38 is extended to a depth of the insulation layer 32. Therefore, the above-mentioned stress propagation can be more effectively prevented. In addition, a crack or a stress which may occur at an interface between the insulation layer 32 and the semiconductor substrate 6 can be prevented from advancing or propagating, respectively.

Third Embodiment

Figure 5:
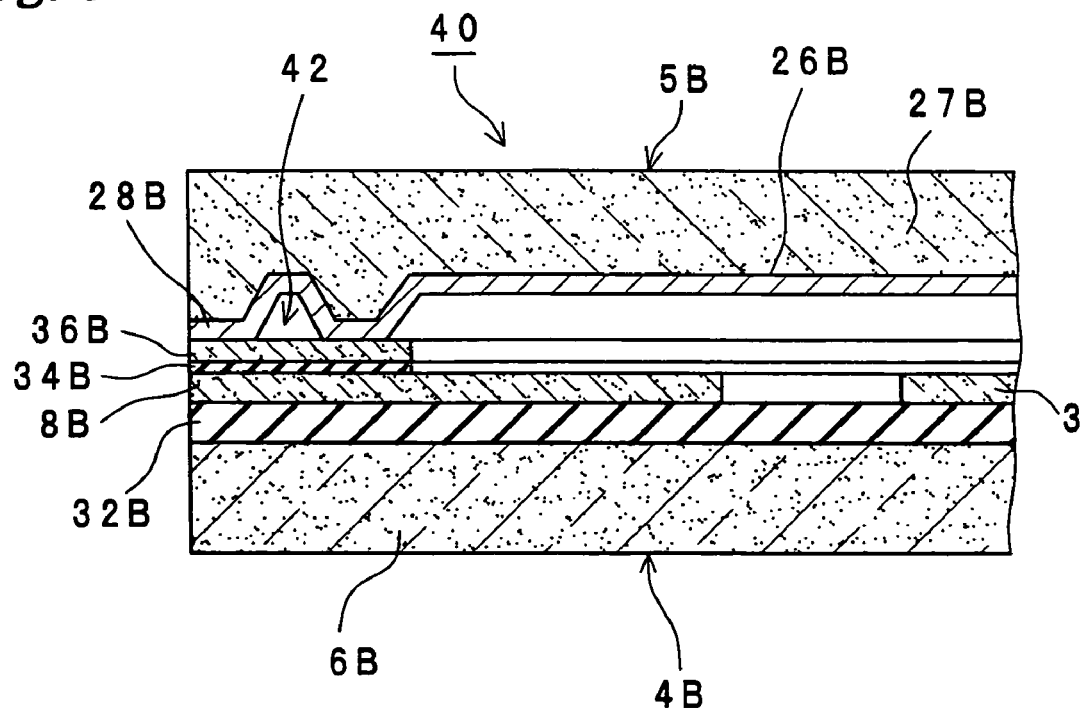
FIG. 5 is an enlarged partial cross-sectional view showing a third embodiment of the acceleration sensor according to the invention.

Referring to FIG. 5, the acceleration sensor 40 of the third embodiment is similar to the acceleration sensor 30 of the second embodiment except that a groove 42 in the form of a frame is provided in the cap body 27B at a junction region instead of providing the insulation layer 32B, the frame portion 8B, the insulation layer 34B and the polycrystalline silicon layer 36B of the base portion 4B with the groove 38. The groove 42 may be formed at the same step as that of forming the concave part 26B (e.g. spot facing) or at a different step (e.g. etching) (before the metallic layer 28B is formed on the major surface of the cap 27B).

In this construction, a stress which may propagate through the cap portion 5B can not propagate beyond the groove 42. Therefore, the characteristic of the sensor element 3 is not affected, resulting in a reliable acceleration sensor.

Fourth Embodiment

Figure 6:
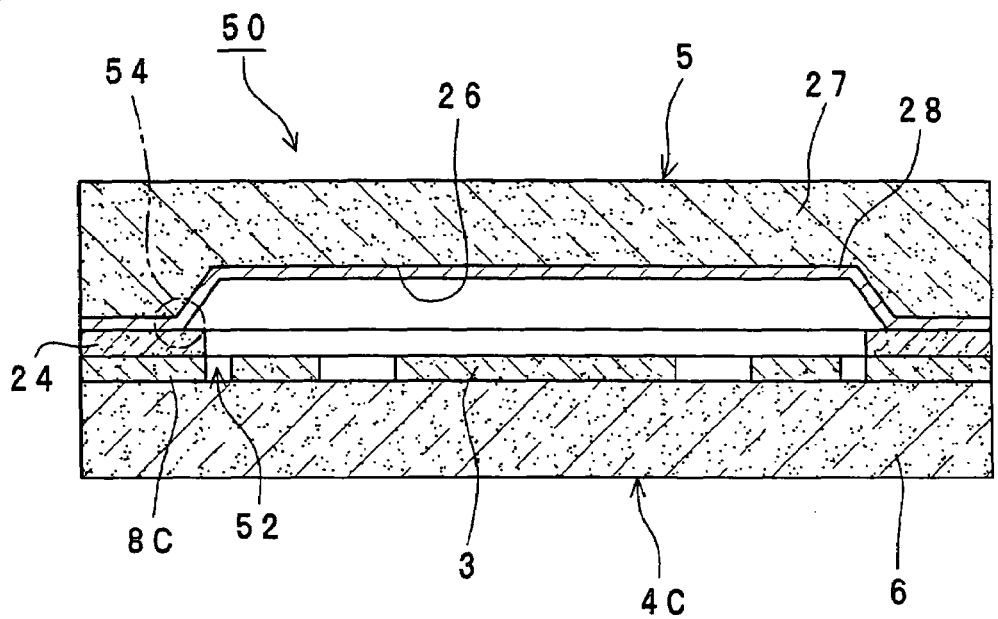
FIG. 6 is a cross-sectional view showing a fourth embodiment of the acceleration sensor according to the invention.
Figure 7:
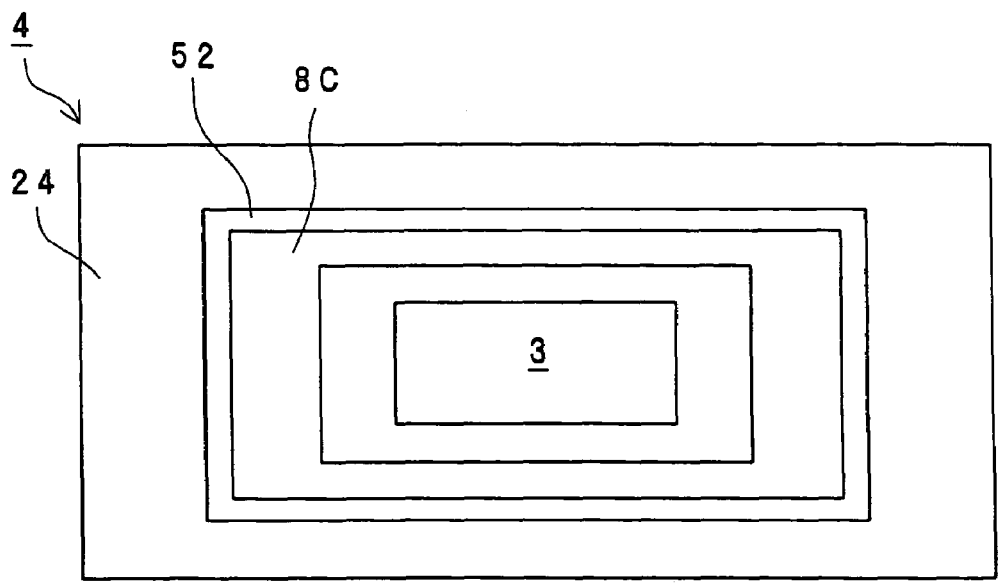
FIG. 7 is a top view of the base portion of FIG. 6.

Referring to FIGS. 6 and 7, the acceleration sensor 50 of the fourth embodiment is similar to the acceleration sensor 2 of the first embodiment except that, instead of providing the groove 25 at a junction region between the base and cap portions, a groove 52 in the form of a frame is provided at a part of the frame portion 8C extended from the junction region toward the acceleration sensor element 3 (i.e. at a part located between the junction region and the acceleration sensor element 3).

With regard to the bonding between the base portion 4C and the cap portion 5, a residual stress generated due to a difference in thermal expansion coefficient between the materials of the polycrystalline and the metallic layers 24 and 28 (i.e. silicon and nickel) is highest at an edge 54 of the junction interface between the polycrystalline silicon layer 24 and the metallic layer 28. Accordingly, without the groove 52, a residual stress might propagate through the frame portion 8C and then the semiconductor substrate 6 to the acceleration sensor element 3, resulting in a characteristic change thereof. In contrast, since the groove 52 can prevent such stress from propagating beyond it, the characteristic of the sensor element 3 is not affected, resulting in a reliable acceleration sensor.

The semiconductor substrate 6 may be formed with a groove in the form of a frame at a position generally identical to that of the frame groove 52 of the frame portion 8C with regard to the major surface direction.

Fifth Embodiment

Figure 8:
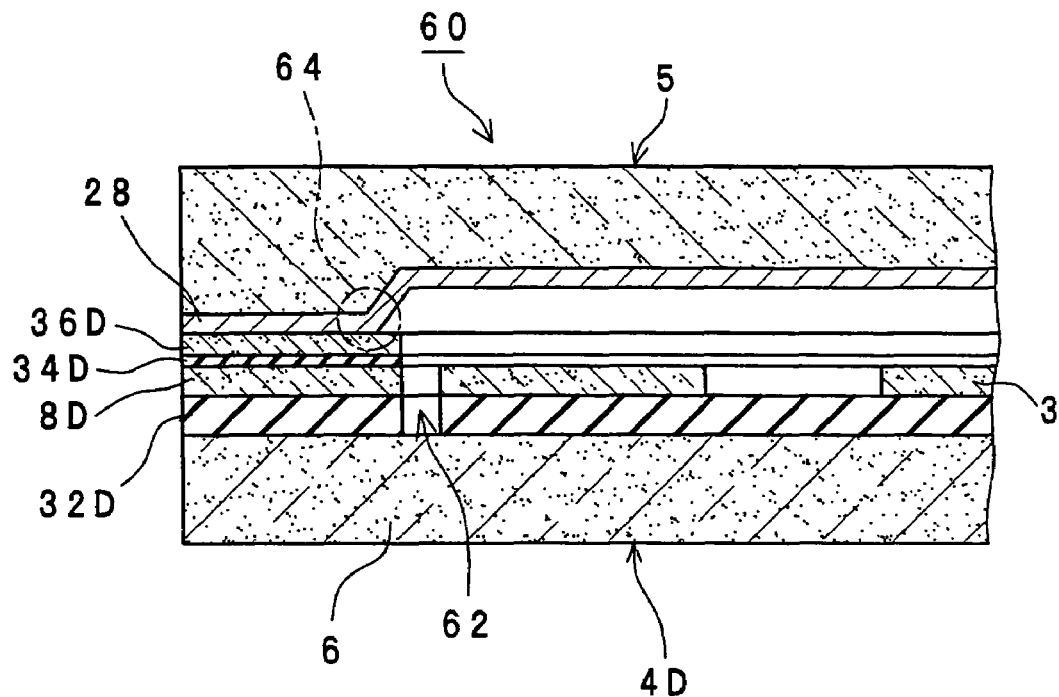
FIG. 8 is an enlarged partial cross-sectional view showing a fifth embodiment of the acceleration sensor according to the invention.

Referring to FIG. 8, the acceleration sensor 60 of the fifth embodiment is similar to the acceleration sensor 30 of the second embodiment except that, instead of providing the groove 38 at a junction region between the base and cap portions, a groove 62 in the form of a frame is provided at a part of the frame portion 8D extended from the junction region toward the acceleration sensor element 3 and at the corresponding part of the insulation layer 32D (i.e., the groove 62 is located between the junction region and the acceleration sensor element 3).

With regard to the bonding between the metallic layer 28 of the cap portion 5 and the polycrystalline silicon layer 36D of the base portion 4D, a residual stress generated due to a difference in thermal expansion coefficient between nickel and silicon is highest at an edge 64 of the junction interface between the metallic layer 28 and the polycrystalline silicon layer 36D. Accordingly, without the groove 62, a residual stress might propagate through the polycrystalline silicon layer 36D, the insulation layer 34D, the frame portion 8D, the insulation layer 32D and then the semiconductor substrate 6 to the acceleration sensor element 3, resulting in a characteristic change thereof. In contrast, since the groove 62 can prevent such stress from propagating beyond it, the characteristic of the sensor element 3 is not affected, resulting in a reliable acceleration sensor.

The semiconductor substrate 6 may be formed with a groove in the form of a frame at a position generally identical to those of the frame grooves of the insulation layer 32D and the frame portion 8D with regard to the major surface direction, so that the frame groove of the semiconductor substrate 6 constitutes, together with the frame grooves of the insulation layer 32D and the frame portion 8D, the frame groove 62.

Sixth Embodiment

Figure 9:
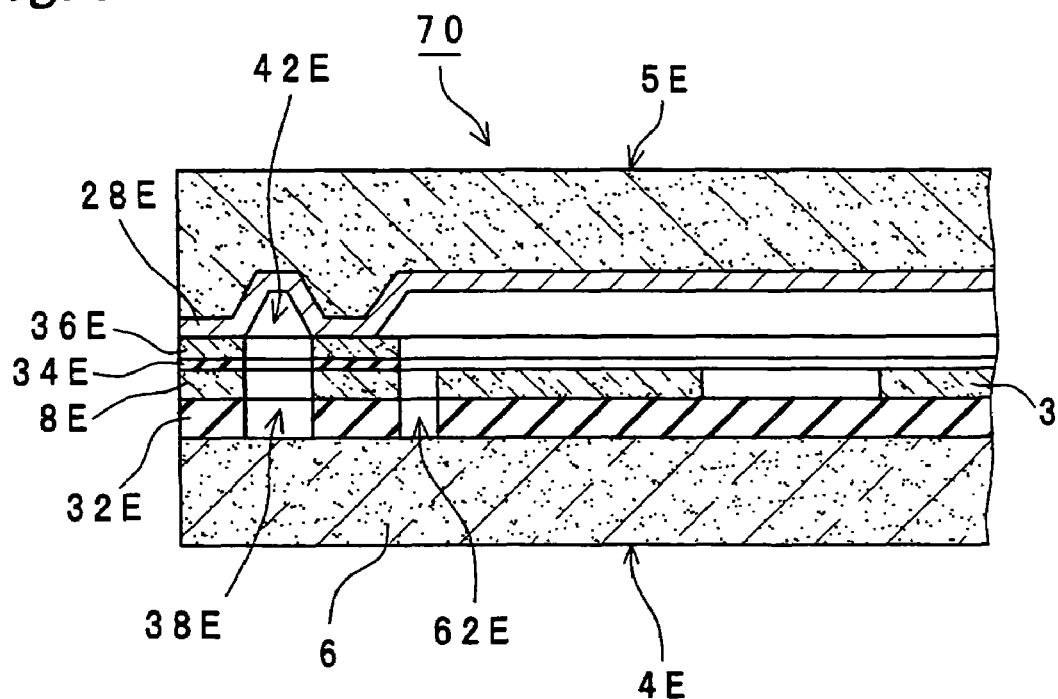
FIG. 9 is an enlarged partial cross-sectional view showing a sixth embodiment of the acceleration sensor according to the invention.

Referring to FIG. 9, the acceleration sensor 70 of the sixth embodiment includes grooves 38E, 42E and 62E similar to the grooves 38, 42 and 62 in the second, third and fifth embodiments. The groove 38E in the insulation layer 32E, the frame portion 8E, the insulation layer 34E and the polycrystalline silicon layer 36E in the base portion 4E and the groove 42E defined by the metallic layer 28E of the cap portion 5E are formed at positions generally identical to each other with regard to the major surface direction of the semiconductor substrate 6, thereby reducing the size of the acceleration sensor 70 with regard to the major surface direction.

Note that the groove 62E can prevent a stress from propagating to the acceleration sensor element 3 without providing the grooves 38E and 42E. These grooves 38E and 42E serve primarily to prevent a possible crack to break the sealing-off of the acceleration sensor 70.

There have been described in detail for preferred embodiments of the acceleration sensor according to the present invention, but it is to be understood that various modifications can be effected within the spirit and scope of the invention.

For example, although the frame grooves formed at the frame portion and at the intermediate layer (e.g. the polycrystalline silicon layer 24 in the first embodiment or a layer including at least the insulation layer 34 in the second embodiment) located between the frame and cap portions, respectively, may not communicate with each other (i.e., the frame groove in the intermediate layer is not a through hole) as long as they are located at generally identical positions with regard to the major surface direction of the semiconductor substrate. However, the groove formed in the intermediate layer is preferably open to an junction interface between the intermediate layer and the cap portion when taken in consideration that the base and cap portions that have been manufactured in different processes are bonded to each other and the groove open to the junction interface is easily formed. In order to deal with a crack or residual stress which may be generated between a plurality of junction interfaces at a junction region between the base and cap portions, the grooves in the frame portion and in the intermediate layer are preferably through holes. This is advantageous in that such grooves are easy to form.

Also, in the second and/or sixth embodiments, a construction in which a groove is not formed on the insulation layer directly deposited on the semiconductor substrate is included within the scope of the present invention.

Further, the frame groove formed in a part of the frame portion internally to a junction region between the intermediate layer and the cap portion may not be a through hole.

What is claimed is:

1. An acceleration sensor comprising:
   a substrate having a major surface;
   an acceleration sensor element and a frame portion surrounding the element, the element and the portion being located on the major surface of the substrate;
   an intermediate layer formed on the frame portion;
   a cap portion bonded to the intermediate layer, thereby sealing-off the acceleration sensor element; and
   grooves in the form of a frame provided in the frame portion and the intermediate layer, respectively, and located at positions generally identical to each other with regard to the major surface direction of the substrate.

2. The acceleration sensor in accordance with claim 1, wherein the grooves in the frame portion and the intermediate layer are through holes.

3. The acceleration sensor in accordance with claim 1, wherein the cap portion is formed with a groove in the form of a frame at an junction region between the cap portion and the intermediate layer, the groove of the cap portion being located at a position generally identical to those of the grooves of the frame portion and the intermediate layer with regard to the major surface direction.

4. An acceleration sensor comprising:
   a substrate having a major surface;
   an acceleration sensor element and a frame portion surrounding the element, the element and the portion being located on the major surface of the substrate;
   an intermediate layer formed on the frame portion; and
   a cap portion bonded to the intermediate layer, thereby sealing-off the acceleration sensor element;
   wherein the frame portion has a part extended from an junction region between the intermediate layer and the cap portion toward the acceleration sensor element, the part being provided with a groove in the form of a frame surrounding the acceleration sensor element.

* * * * *